United States Patent
Taddiken

(10) Patent No.: US 7,518,169 B2
(45) Date of Patent: Apr. 14, 2009

(54) MOS-TRANSISTOR ON SOI SUBSTRATE WITH SOURCE VIA

(75) Inventor: Hans Taddiken, Munich (DE)

(73) Assignee: Infineon Technologies AG, Munich (DE)

( * ) Notice: Subject to any disclaimer, the term of this patent is extended or adjusted under 35 U.S.C. 154(b) by 268 days.

(21) Appl. No.: 11/120,162

(22) Filed: May 2, 2005

(65) Prior Publication Data

US 2005/0253175 A1 Nov. 17, 2005

Related U.S. Application Data

(63) Continuation of application No. PCT/EP03/11843, filed on Oct. 24, 2003.

(30) Foreign Application Priority Data

Oct. 31, 2002 (DE) ................ 102 50 832

(51) Int. Cl.
*H01L 29/72* (2006.01)
(52) U.S. Cl. ............... 257/288; 257/347; 257/774; 438/589
(58) Field of Classification Search ........ 257/288, 257/347, 774; 438/589
See application file for complete search history.

(56) References Cited

U.S. PATENT DOCUMENTS

| | | | |
|---|---|---|---|
| 5,511,428 A * | 4/1996 | Goldberg et al. | ......... 73/777 |
| 5,548,150 A | 8/1996 | Omura et al. | |
| 5,929,488 A * | 7/1999 | Endou | ......... 257/347 |
| 6,002,154 A | 12/1999 | Fujita | |
| 6,034,415 A | 3/2000 | Johnson et al. | |
| 6,063,678 A | 5/2000 | D'Anna | |
| 6,153,912 A | 11/2000 | Holst | |
| 6,218,232 B1 | 4/2001 | Heo | |
| 6,297,533 B1 | 10/2001 | Mkhitarian | |
| 6,611,002 B2 * | 8/2003 | Weeks et al. | ......... 257/94 |
| 7,154,148 B2 * | 12/2006 | Yamazaki et al. | ......... 257/347 |

FOREIGN PATENT DOCUMENTS

| | | |
|---|---|---|
| EP | 0 562 271 A1 | 9/1993 |
| WO | WO 97/24758 A1 | 7/1997 |
| WO | WO 98/57379 A1 | 12/1998 |
| WO | WO 99/40614 A2 | 8/1999 |

* cited by examiner

*Primary Examiner*—Edward Wojciechowicz
(74) *Attorney, Agent, or Firm*—Maginot, Moore & Beck

(57) ABSTRACT

In an inventive MOS transistor having a source region, a drain region and a channel region, which are formed in a semiconductor layer of an SOI substrate, which has a semiconductor substrate below the semiconductor layer and an isolation layer between semiconductor layer and semiconductor substrate, the drain or source region is electrically connected to a backside contact on a side of the semiconductor substrate facing away from the isolation layer by a via running through the semiconductor substrate. The central idea of the present invention is to obtain an easy contactability of an MOS transistor without limitations in the application spectrum, by leading a via either from the source or the drain region across both the isolation layer and the semiconductor substrate to a backside contact, to be electrically connected to the same, since thereby the requirements of the material properties of the semiconductor substrates, such as doping and conductivity, are unnecessary or reduced.

5 Claims, 3 Drawing Sheets

MOS-TRANSISTOR ON SOI SUBSTRATE WITH SOURCE VIA

CROSS-REFERENCE TO RELATED APPLICATION

This application is a continuation of copending International Application No. PCT/EP03/11843, filed Oct. 24, 2003, which designated the United States and was not published in English.

BACKGROUND OF THE INVENTION

1. Field of the Invention

The present invention relates to MOS transistors and particularly to MOS transistors, which are suitable for RF power applications and constructed on SOI (silicon on isolator) basis.

2. Description of the Related Art

MOS transistors that are suitable for RF power applications need to have low parasitic capacities to have as little low pass characteristics as possible. A reduction of the parasitic capacities is possible by constructing MOS transistors on an SOI substrate. Such SOI MOS transistors are described, for example, in EP 0562271 A1, WO99/40614 A2 and WO97/24758 A1. The problem of the RF power transistors shown there is that, on the one hand, the overall transistor is divided into individual transistors, called fingers, which are generally disposed in parallel to each other, for obtaining a high transistor width to be suitable as RF power transistor, and that, on the other hand, all terminals of the transistor fingers, i.e. drain, gate and source terminal, are formed on the same semiconductor layer of the SOI substrate. Under these conditions it is difficult to appropriately combine and connect, respectively, the three different terminals of the transistor fingers disposed in parallel to each other at the only two available ends of the parallel transistor fingers. Combining the transistor fingers leads to more expensive and larger housing structures and wirings on the semiconductor layer and also to undesired inductivities at the source terminals by bonding wires.

Among the MOS transistors formed in a single substrate where the drain, source and channel regions are formed in an epitaxial semiconductor layer of a semiconductor substrate and which is less suitable for RF power applications due to the higher parasitic capacities, there are so-called LDMOS transistors, where so-called sinkers, i.e. indiffused deep-reaching regions, make a connection between the source region in the epitaxial layer where the transistor is formed and the chip backside, in that they extend down into the highly doped semiconductor substrate on which the epitaxial layer is. The source terminal is formed as metallization on the back of the chip and the back of the semiconductor substrate, respectively. In these transistors, transistor fingers disposed in parallel to each other can be wired such that the gate and drain terminals are combined on opposite ends of the transistor fingers, while the source terminal is, for example, connected to ground via the back of the chip. For improving, for example, the transistor finger repetition distance and the resistance, U.S. Pat. No. 6,297,533 B1, U.S. Pat. No. 6,063,678 and WO 98/57379 A1 suggest to replace the sinker structures by vias of different types, which connect the source region in the epitaxial layer to the semiconductor substrate lying below.

With regard to FIG. 3, an example of a known HF LDMOS power transistor, which is formed in an epitaxial layer of a semiconductor substrate, is explained in more detail. The power transistor comprises a substrate 100 with an active region 102, wherein the source, gate and channel and drain regions, respectively, of the transistor are formed, as it is indicated in the lower portion of FIG. 3. As can be seen in FIG. 3, in the shown LDMOS transistor for RF power applications, the whole transistor width is divided into individual transistor structures and transistors (fingers), respectively, which are disposed in parallel to each other according to the common configuration.

The active region 102 comprises a plurality of transistor structures $T_1$ to $T_4$. The first transistor structure $T_1$ and the second structure $T_2$ comprise a source region $S_1$, and $S_{2/3}$ each as well as a gate region $G_1$ and $G_2$ each. Further, the transistor structures $T_1$ and $T_2$ comprise a common drain region $D_{1/2}$, which is disposed between the two gate structures $G_1$ and $G_2$, as can be seen. In the same way, the transistor structures $T_3$ and $T_4$ comprise a source region $S_{2/3}$ and $S_4$ each as well as a gate region $G_3$ and $G_4$ each. Similar to the structures $T_1$ and $T_2$, the transistor structures $T_3$ and $T_4$ comprise a common drain region $D_{3/4}$, which is disposed between the gate regions $G_3$ and $G_4$. As can be seen, the individual transistor structures $T_1$ to $T_4$ are disposed in parallel to one another and extend from a first side 104 of the active region 102 to a second side 106 of the active region 102, which is opposed to the first side 104.

On the substrate 100, adjacent to the first side 104 of the active region 102, a gate terminal 110 is formed, which, in the embodiment shown in FIG. 1a, comprises four finger-shaped portions 110a to 110d, which extend starting from the second side 104 of the active region 102 across the gate regions $G_1$, $G_2$, $G_3$ and $G_4$ in the direction of the second side 106 of the active region 102. Further, adjacent to the second side 106 of the active region 102, a drain terminal 112 is formed, which comprises two finger-shaped portions 112a and 112b, which extend starting from the second side 106 of the active region 102 across the drain regions $D_{1/2}$ and $D_{3/4}$. The finger-shaped portions 110c to 110d of the gate terminal 110 as well as of the finger-shaped portions 112a and 112b of the drain terminal 112 are disposed in parallel to each other.

Further, the transistor structure shown in FIG. 3 comprises gate connections 114a and 114b disposed on the second side 106 of the active region 102, to electrically connect the gate regions of adjacent transistor structures. The gate connection 114a is provided to electrically connect the fingers 110a and 110b of the gate terminal 110. In the same way, the gate connection 114b is provided to electrically connect the fingers 110b and 110d of the gate terminal 110. This electrical connection of the fingers 110a/110b and 110c and 110d at the finger end is advantageous to obtain a distribution of an input signal applied to a gate terminal 110, which is as even as possible.

The simple combination of gate terminals and drain terminals of the transistor fingers is enabled by contacting the source terminal across the semiconductor substrate, which is below the epitaxial layer, wherein the structures shown in FIG. 3 are formed. A disadvantage of the RF power transistor of FIG. 3, however, is its inherent higher parasitic capacity due to the well structure in an epitaxial layer of a semiconductor substrate.

U.S. Pat. No. 5,548,150 A describes, with reference to FIGS. 12, 39 and 41, an MOSFET on SOI basis, where a trench structure is formed below the source electrode and filled with a conductive material with high thermal conductivity, whereby the source electrode is brought into thermal contact with the silicon substrate, part of the silicon substrate further serves as a source electrode and the heat dissipation characteristics are improved. While this MOSFET structure enables, on the one hand, the above-described easy contactability of the transistor, and, on the other hand, provides at the same time the advantages of using a SOI substrate with regard to the lower parasitic capacities, it is disadvantageous that the structure cannot be used in any application, for example when the semiconductor substrate of the SOI substrate has to have a high resistance due to a coil to be integrated, so that the same cannot serve as source electrode.

SUMMARY OF THE INVENTION

It is an object of the present invention to provide a transistor as well as a method for producing the same, so that the same is suitable for high-frequency power applications, and a reduction of the layout effort and/or the chip area is enabled without limiting the spectrum of possible applications.

In accordance with a first aspect, the present invention provides An MOS transistor having a source region, a drain region and a channel region formed in a semiconductor layer of an SOI substrate having a semiconductor substrate below the semiconductor layer and an isolation layer between semiconductor layer and semiconductor substrate, wherein the drain or source region is electrically connected to a backside contact formed on the side of the semiconductor substrate facing away from the isolation layer through a via running through the semiconductor substrate. The via has an opening filled with a conductive material running from the one of the drain or source region at least through the isolation layer, and wherein a portion of the via extending through the semiconductor substrate has a greater conductivity than surrounding portions of the semiconductor substrate.

In some preferred embodiments, the via has a contact opening filled with a conductive material running from the source region to the side of the semiconductor substrate facing away from the isolation layer. In other embodiments, the via has an opening running through the isolation layer and filled with a contact material as well as a via region of the semiconductor substrate running from the opening through the semiconductor substrate to the backside contact, wherein the doping in the via region of the semiconductor substrate is increased and lies between $1 \times 10^{16}$ and $3 \times 10^{20}$ 1/cm$^3$, while the main doping of the substrate lies between $1 \times 10^{12}$ and $1 \times 10^{16}$ 1/cm$^3$.

In accordance with a second aspect, the present invention provides an RF power transistor having several transistors having a source region, a drain region and a channel region formed in a semiconductor layer of an SOI substrate having a semiconductor substrate below the semiconductor layer and an isolation layer between semiconductor layer and semiconductor substrate, wherein the drain or source region is electrically connected to a backside contact formed on the side of the semiconductor substrate facing away from the isolation layer through a via running through the semiconductor substrate. The via has an opening filled with a conductive material running from the one of the drain or source region at least through the isolation layer, and wherein a portion of the via extending through the semiconductor substrate has a greater conductivity than surrounding portions of the semiconductor substrate.

In accordance with a third aspect, the present invention provides a method for producing an MOS transistor, having the steps of: providing an SOI substrate having a semiconductor layer, a semiconductor substrate and an isolation layer below the semiconductor layer between semiconductor layer and semiconductor substrate; forming a source, a drain and a channel region in the semiconductor layer of the SOI substrate; and generating a via, which electrically connects the source region or the drain region to a backside contact formed on the side of the semiconductor substrate facing away from the isolation layer. The via has an opening filled with a conductive material running from the one of the drain or source region at least through the isolation layer, and wherein a portion of the via extending through the semiconductor substrate has a greater conductivity than surrounding portions of the semiconductor substrate.

One idea of the present invention is to obtain an easy contactability of an MOS transistor without limitations in the application spectrum, by leading a via either from the source or the drain region both across the isolation layer and the semiconductor substrate to a backside contact, to be electrically connected to the same, since thereby the requirements of the material properties of the semiconductor substrate, such as doping and conductivity, respectively, are omitted and reduced, respectively. Compared to the above-described MOSFET structure of U.S. Pat. No. 5,548,150, an extended application spectrum results. With regard to the common procedure of wiring SOI MOS transistors, according to which gate, source and drain terminals are only wired from one side, exploiting the backside contact disposed below all layers as source terminal directly connected through the vias resulting in a significantly simplified wiring, particularly in power amplifiers where a plurality of transistor fingers are disposed in parallel to one another.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 2:
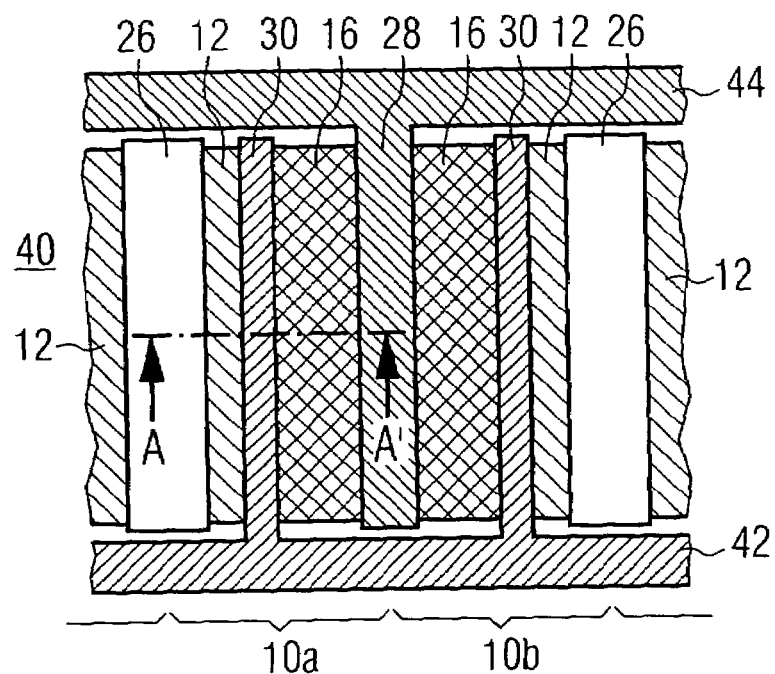
FIG. 2 is a top view of a part of a power amplifier consisting of transistors of FIG. 1a according to an embodiment of the present invention.

First, with reference to FIG. 1a, an embodiment for an LDMOS transistor according to the present invention will be described. The transistor, generally indicated by 10, comprises a source region 12 of a first conductivity type, namely exemplarily a strongly n doped "n+" source region, a channel and gate region 14, respectively, of a second conductivity type, here exemplarily a weakly p doped p-region, and a drain region of a first conductivity type, which consists here exemplarily of a weakly n doped LDD region 16a (LDD=lightly doped drain) and a strongly n doped drain contact region 16b, wherein the regions 12-16 are formed in a semiconductor layer, such as of silicon, 18. If necessary, the semiconductor layer 18 is already appropriately weakly predoped. The semiconductor layer is part of an SOI substrate 20 and separated by a buried isolation layer 22, such as of silicon dioxide from a semiconductor substrate 24, which is, for example, also formed of silicon. A source terminal 26 is directly above the source region 12, which is electrically connected to the same. Accordingly, a drain terminal 28 is directly above and in electrical connection to the drain region 16b. A gate 30 is directly above the p channel region 14 and is separated from the same by an isolation layer 32, such as silicon dioxide, in order to be effectively coupled to the same, wherein the isolation layer further serves as protective layer for the whole transistor 10 and thus covers the whole structure. The source terminal 26 extends in the form of a via 34 through the semiconductor layer 18, the isolation layer 22 and the semiconductor substrate 24 towards the bottom to a metallization and backside contact, respectively, which serves as source terminal 36 located on the side and main surface of the semiconductor substrate 24, respectively, facing away from the semiconductor layer 18. Thus, the via 34 enables an electrical connection of the source region 12 to the backside contact 36.

Figure 1A:
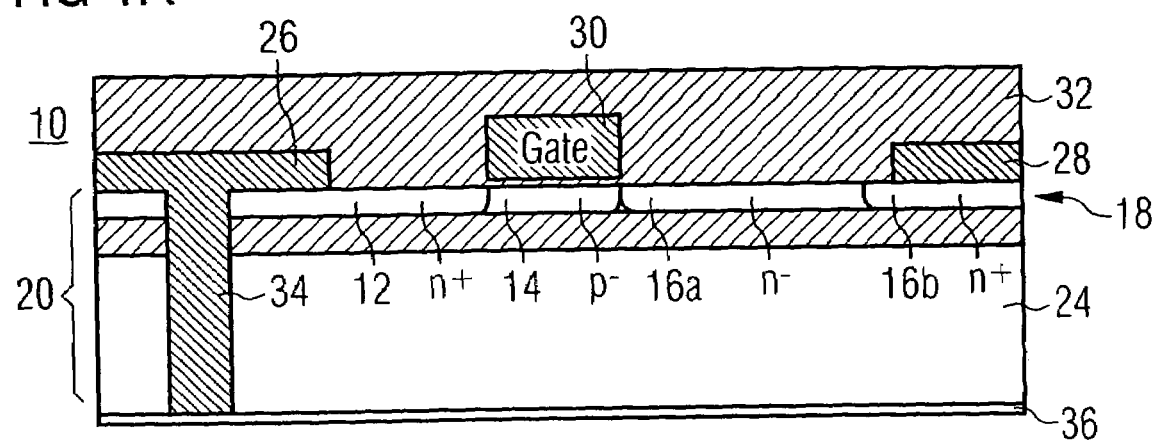
FIG. 1a is a cross section of transistors and a transistor finger, respectively, according to an embodiment of the present invention.

For producing the MOS transistor 10 of FIG. 1a, first, the regions 12-16 are formed by appropriate doping methods, such as thermal doping by diffusion or other doping methods, such as ion implantation or the same, in the semiconductor layer 18 of the SOI substrate 20, for example starting from the SOI substrate 20, where, if necessary, the semiconductor layer 18 is appropriately predoped.

After providing the SOI substrate 20 as well as forming the regions 12 to 16, a continuous opening is generated by an appropriate method, such as dry or wet etching, preferably an anisotropic etching method, through the upper semiconductor layer 18, the isolation layer 22 lying below and the semiconductor substrate 24, which extends in lateral direction at least partly into the source region and runs in a vertical direction from the source region 12 to the side of the semiconductor substrate 24 opposing the isolation layer 22. In order to avoid etching of a continuous opening and a hole, respectively, the SOI substrate could be disposed on a sacrificial substrate, which serves as etch stop during etching the opening. Then, a conductive material, such as tungsten, is introduced into the opening generated in that way, by an appropriate method, such as a CVD method, whereby an electrical connection to the source region 12 is made. The optional sacrificial layer could then be ground or etched away.

The process step where the opening is filled with conductive material to form the via 34 can further simultaneously serve for forming the source terminal 26 on the surface of the semiconductor layer 18. Otherwise, the source terminal is either omitted or formed in a further separate process step, such as by lithography, with the drain terminal 28 on the surface of the semiconductor layer 18. Depositing an isolation layer on the resulting structure, depositing the gate terminal 30 and depositing a further isolation layer on the resulting structure as well as providing the metallization 36 on the backside of the SOI substrate 20 leads then to the transistor 10 shown in FIG. 1a.

In FIG. 2, an embodiment for an RF power amplifier and RF power transistor, respectively, is shown, where the transistor shown in FIG. 1a serves as one transistor finger among many, wherein in FIG. 2 the cross section shown in FIG. 1a is indicated by A and A'. For avoiding repetitions, the same elements in FIGS. 1a and 2 are provided with the same reference numbers, wherein a repeated description of the same is omitted.

As indicated in FIG. 2 below, the RF power amplifier, generally indicated by 40, consists of several transistor fingers 10a and 10b disposed in parallel to each other. Every transistor finger 10a and 10b is constructed as shown in FIG. 1a and comprises a finger-like source terminal 26, a finger-like source region 12, a finger-like gate terminal 30, a channel region 14 lying below and thus not visible, a drain region 16 (16a and 16b) and a drain terminal 28, which are all disposed in parallel to each other. The transistor fingers 10a and 10b are alternately twisted to each other as a whole by 180° and alternately disposed to each other in a mirror symmetrical way, respectively, so that their source terminals 26 and drain terminals 28 lie beside each other and are formed integrally. Due to the fact that the source regions 12 are electrically connected to the source terminal on the backside of the SOI substrate, which is, for example, connected to ground, through the vias (34 in FIG. 1a), which run through the semiconductor layer, wherein the transistor fingers are formed, the isolation layer and the semiconductor substrate of the SOI substrate, it is possible to combine and to electrically connect, respectively, the gate terminals 30 and the drain terminals 28 at opposing ends of the same. Thus, the gate terminals 30 as shown in FIG. 2 are always connected to each other on the lower end seen from FIG. 2 by a gate terminal metal trace 42 running perpendicular to the assembly direction, while the drain terminals 28 are connected to each other at the opposite ends, i.e. the upper ends seen from FIG. 2, via a drain terminal metal trace 44 running perpendicular to the assembly direction. As already described in the introduction to the specification, the other, i.e. other upper ends of the gate terminals 30 can be connected by ridges, which connect two gate terminals 30 adjacent to a drain terminal 28 via the respective gate terminal (not shown in FIG. 2).

Consequently, the above RL power amplifier allows a compact layout by using SOI LDMOS transistors with less parasitic capacity due to the SOI technique, wherein additionally, the application spectrum is not limited by material requirements of the semiconductor substrate of the SOI substrate, such as in the case of SOC (system on chip) applications, where coils are integrated, which require a high-resistive semiconductor substrate.

With reference to the previous description, it should be noted that the doping ratios, as described above, can be reversed. Also, the exact type of transistors formed in the semiconductor layer of the SOI substrate is not significant for the present invention, and thus, the LDD region of the drain region can also be omitted or the channel region can have a doping gradient.

In contrary, to the previous description, where the via has been formed by etching a hole and subsequently filling the same by a conductive material, it is further possible that the via is formed by a trench and a hole, respectively, merely extending to the semiconductor substrate through the isolation layer, which is filled with a conductive material, and a region running from this hole and trench, respectively, to the backside contact, wherein the conductivity of the semiconductor substrate is significantly increased via doping. Exemplary doping heights for the deliberate doping of the regions of the semiconductor substrate forming the via comprise, for example, dopings of about $10^{16}$ to several $10^{20}$ $1/cm^3$, wherein this concentration can rise from one side of the substrate to the other side. The base doping of the substrate is then in the range of $10^{12}$ to $10^{16}$ $1/cm^3$.

Further, it should be noted that the previous description relates merely exemplarily to the frequent case where an RF power transistor is used in an integrated circuit within a source circuit. However, the invention can also be useful when the drain regions are connected to the backside contact on the backside of the SOI substrate.

Figure 1B:
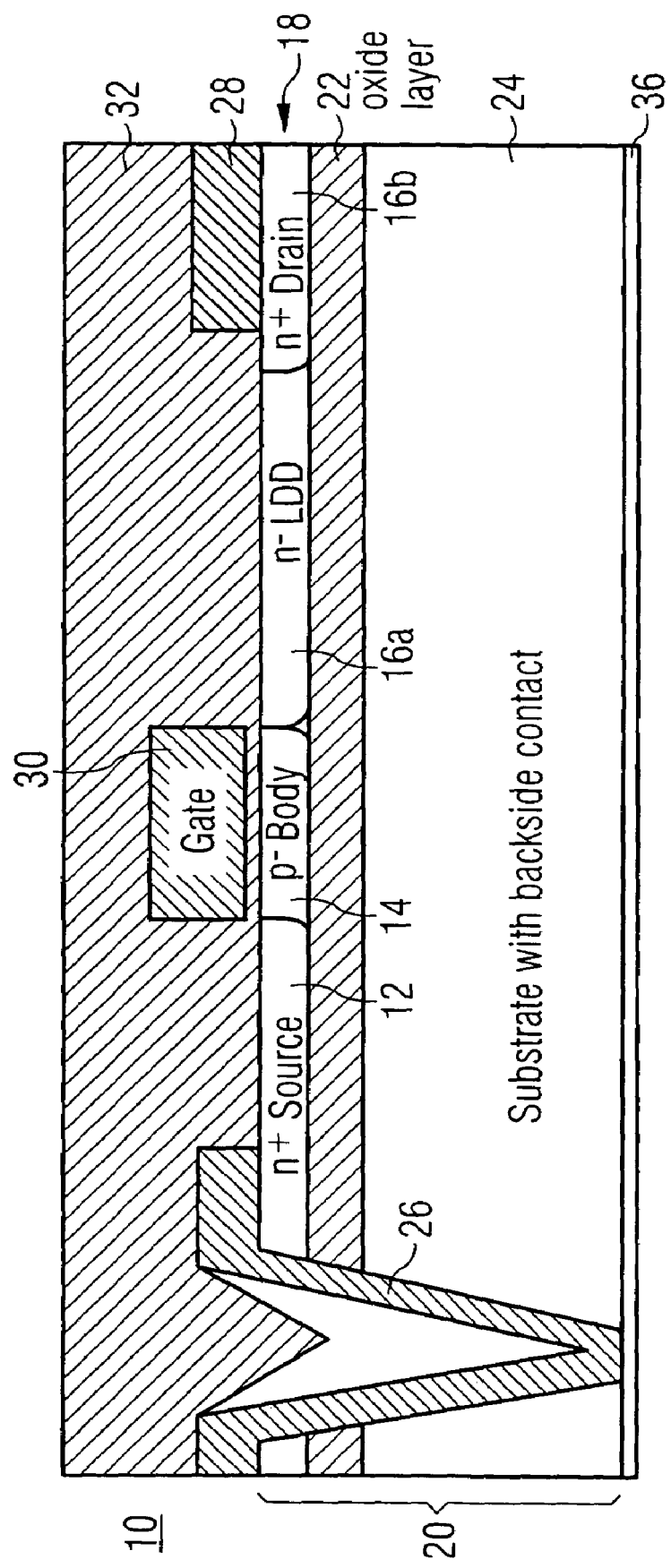
FIG. 1b is a cross section of a transistor and a transistor finger, respectively, according to a further embodiment of the present invention.
Figure 3:
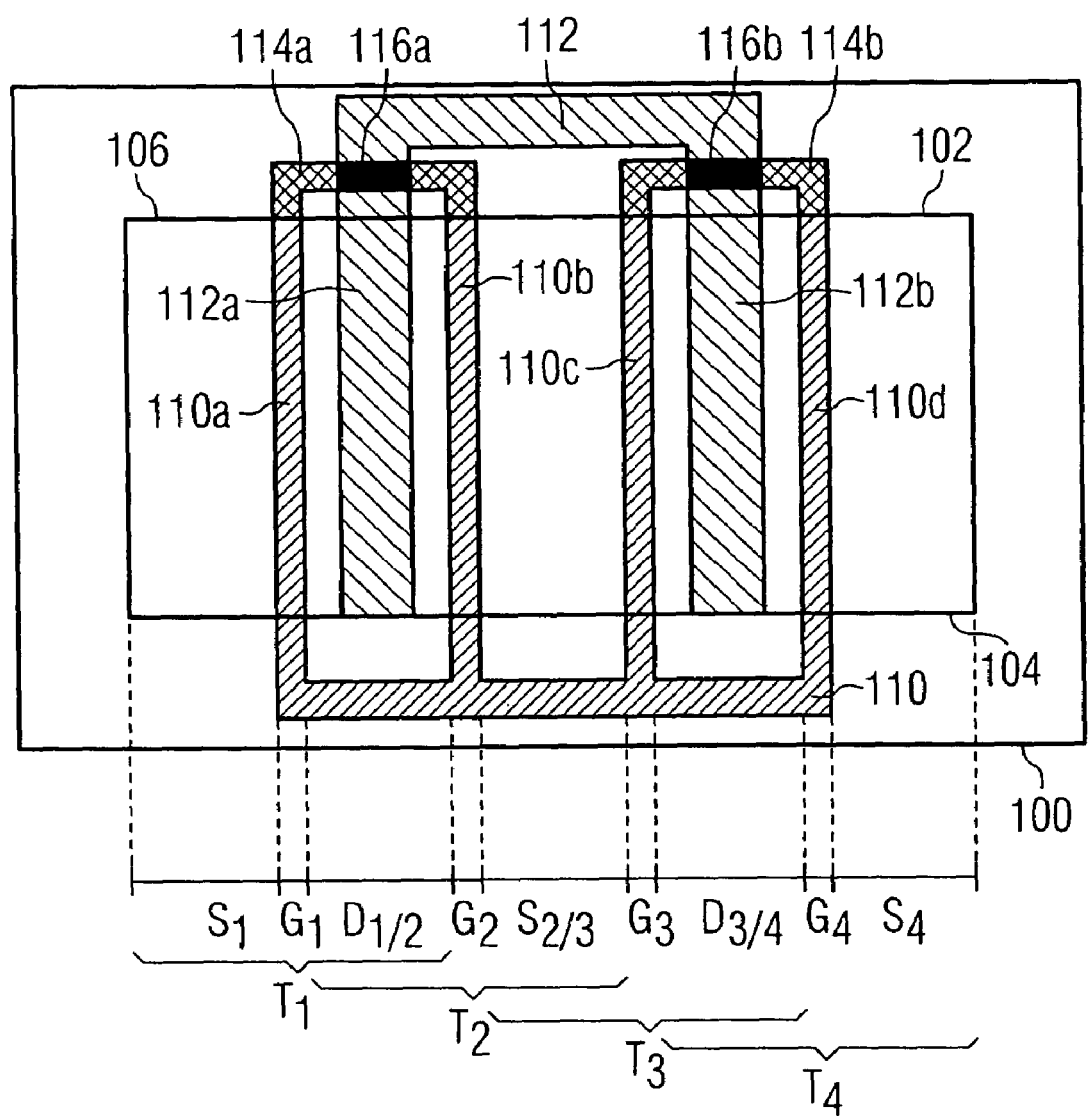
FIG. 3 is a top view of a conventional LDMOS power amplifier, which is formed in an epitaxial layer on a semiconductor substrate.

Additionally, any type of contacting can be used as source-side via. While a via extending perpendicularly towards the bottom with constant cross section has been used in the embodiment of FIG. 1a, a via becoming narrower towards the bottom can also be used. Such a via could, for example, be generated by plasma etching of a trench region not protected by a photosensitive mask, which extends laterally at least partly into the source region and vertically to the backside contact, and subsequently depositing metal on the V-shaped trench generated thereby, for example by sputtering. An SOI LDMOS transistor constructed that way which merely differs from the one in FIG. 1a by the above-mentioned V-shaped trench contacting is shown in FIG. 1b.

While this invention has been described in terms of several preferred embodiments, there are alterations, permutations, and equivalents which fall within the scope of this invention.

It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An MOS transistor having a source region, a drain region and a channel region formed in a semiconductor layer of an SOI substrate having a semiconductor substrate below the semiconductor layer and an isolation layer between semiconductor layer and semiconductor substrate, wherein one of the drain or source region is electrically connected to a backside contact formed on the side of the semiconductor substrate facing away from the isolation layer through a via running through the semiconductor substrate, wherein the via has an opening filled with a conductive material running from the one of the drain or source region at least through the isolation layer, and wherein a portion of the via extending through the semiconductor substrate has a greater conductivity than surrounding portions of the semiconductor substrate, wherein the portion of the via extending through the semiconductor substrate comprises a continuation of the opening filled with a conductive material so that the opening runs to the side of the semiconductor substrate facing away from the isolation layer, and so that a continuous path of the conductive material extends through the via from said side of the semiconductor substrate to a side of the semiconductor layer facing away from the isolation layer, the conductive material comprising metal and the semiconductor substrate having a doping concentration lying between $1 \times 10^{12}$ and $1 \times 10^{16}$ cm$^{-3}$.

2. An MOS transistor having a source region, a drain region and a channel region formed in a semiconductor layer of an SOI substrate having a semiconductor substrate below the semiconductor layer and an isolation layer between semiconductor layer and semiconductor substrate, wherein one of the drain or source region is electrically connected to a backside contact formed on the side of the semiconductor substrate facing away from the isolation layer through a via running through the semiconductor substrate, wherein the via has an opening filled with a conductive material running from the one of the drain or source region at least through the isolation layer, and wherein a portion of the via extending through the semiconductor substrate has a greater conductivity than surrounding portions of the semiconductor substrate, wherein the portion of the via extending through the semiconductor substrate comprises an increased doping concentration in the semiconductor substrate running from the opening through the semiconductor substrate to the backside contact, and wherein the increased doping concentration is approximately between $1 \times 10^{16}$ and $3 \times 10^{20}$ 1/cm$^3$, while a main doping concentration of the substrate lies between $1 \times 10^{12}$ and $1 \times 10^{16}$ 1/cm$^3$.

3. The MOS transistor according to claim 1, wherein the one of the drain or source region is the source region, and the MOS transistor further comprises a drain terminal and a gate terminal, the gate terminal disposed on a side facing away from the SOI substrate, and wherein the gate terminal is coupled to the channel region and the drain terminal is electrically connected to the drain region.

4. An RF power transistor having a plurality of transistors, each having a source region, a drain region and a channel region formed in a semiconductor layer of an SOI substrate having a semiconductor substrate below the semiconductor layer and an isolation layer between semiconductor layer and semiconductor substrate, wherein one of the drain or source region is electrically connected to a backside contact formed on the side of the semiconductor substrate facing away from the isolation layer through a via running through the semiconductor substrate, wherein the via has an opening filled with a conductive material running from the one of the drain or source region at least through the isolation layer, and wherein a portion of the via extending through the semiconductor substrate has a greater conductivity than surrounding portions of the semiconductor substrate, wherein the portion of the via extending through the semiconductor substrate comprises a continuation of the opening filled with a conductive material so that the opening inns to the side of the semiconductor substrate facing away from the isolation layer, and so that a continuous path of the conductive material extending through the via from said side of the semiconductor substrate to a side of the semiconductor layer facing away from the isolation layer, the conductive material comprising metal and the semiconductor substrate having a doping concentration lying between $1 \times 10^{12}$ and $1 \times 10^{16}$ cm$^{-3}$, wherein the plurality of transistors are arranged juxtaposed to each other, and the RF power transistor comprises drain and gate terminals arranged in an interdigitated manner, the drain terminals and the gate terminals electrically connected at opposing ends so that each drain terminal is electrically connected to the drain regions of the neighboring transistor, and wherein the one of the drain or source region is the source region, so that each via is electrically connected to the source region of two neighboring transistors, and the backside contact is commonly connected to the source region of all transistors.

5. An RF power transistor having a plurality of transistors, each having a source region, a drain region and a channel region formed in a semiconductor layer of an SOI substrate having a semiconductor substrate below the semiconductor layer and an isolation layer between semiconductor layer and semiconductor substrate, wherein one of the drain or source region is electrically connected to a backside contact formed on the side of the semiconductor substrate facing away from the isolation layer through a via running through the semiconductor substrate, wherein the via has an opening filled with a conductive material running from the one of the drain or source region at least through the isolation layer, and wherein a portion of the via extending through the semiconductor substrate has a greater conductivity than surrounding portions of the semiconductor substrate, wherein the portion of the via extending through the semiconductor substrate comprises an increased doping portion of the semiconductor substrate running from the opening through the semiconductor substrate to the backside contact, and wherein the increased doping portion has a doping concentration of approximately between $1 \times 10^{16}$ and $3 \times 10^{20}$ 1/cm$^3$, while the main doping concentration of the substrate lies between $1 \times 10^{12}$ and $1 \times 10^{16}$ 1/cm$^3$, wherein the plurality of transistors are arranged juxtaposed to each other, and the RF power transistor comprises drain and gate terminals arranged in an interdigitated manner, the drain terminals and the gate terminals electrically connected at opposing ends so that each drain terminal is electrically connected to the drain regions of the neighboring transistor, and wherein the one of the drain or source region is the source region, so that each via is electrically connected to the source region of two neighboring transistors, and the backside contact is commonly connected to the source region of all transistors.

* * * * *

UNITED STATES PATENT AND TRADEMARK OFFICE
CERTIFICATE OF CORRECTION

PATENT NO. : 7,518,169 B2 Page 1 of 1
APPLICATION NO. : 11/120162
DATED : April 14, 2009
INVENTOR(S) : Taddiken It is certified that error appears in the above-identified patent and that said Letters Patent is hereby corrected as shown below:

Claim 4 (column 8, line 13): replace "inns" with --runs--

Signed and Sealed this

Eighth Day of September, 2009

David J. Kappos
*Director of the United States Patent and Trademark Office*